Figure 1:
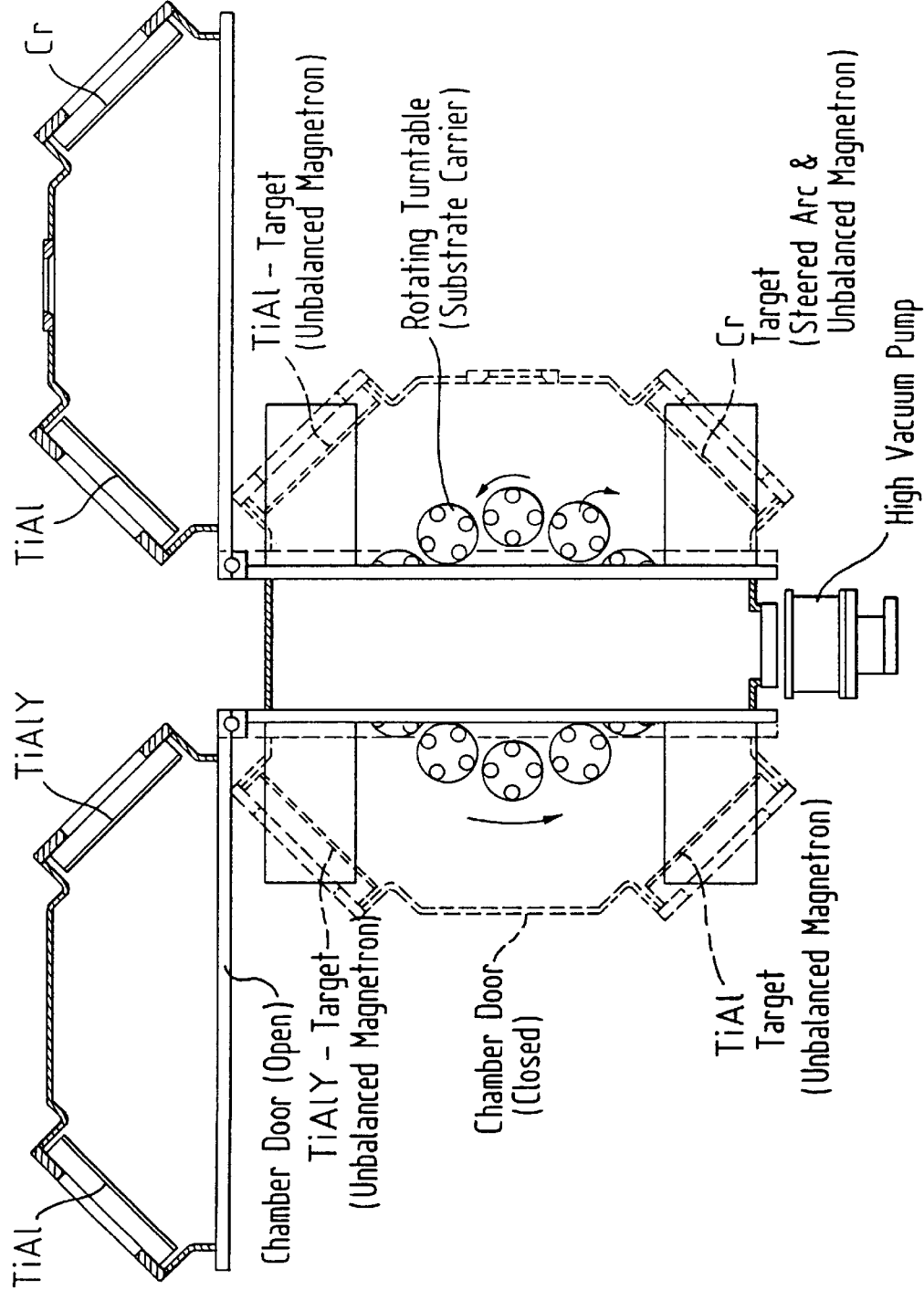

United States Patent [19]
Muenz et al.

[11] Patent Number: 6,033,768
[45] Date of Patent: Mar. 7, 2000

[54] HARD MATERIAL COATING WITH YTTRIUM AND METHOD FOR ITS DEPOSITION

[75] Inventors: Wolf-Dieter Muenz; Ian Smith; Lee Adrian Donohue; John Stuart Brooks, all of Sheffield, United Kingdom

[73] Assignee: Hauzer Industries BV, Venlo, Netherlands

[21] Appl. No.: 08/945,871

[22] PCT Filed: Mar. 11, 1997

[86] PCT No.: PCT/EP97/01234

§ 371 Date: Nov. 3, 1997

§ 102(e) Date: Nov. 3, 1997

[87] PCT Pub. No.: WO97/34023

PCT Pub. Date: Sep. 18, 1997

[30] Foreign Application Priority Data

Mar. 12, 1996 [DE] Germany ............. 196 09 647

[51] Int. Cl.$^7$ ........................ C23C 14/14

[52] U.S. Cl. ............. 428/216; 51/295; 51/307; 51/309; 204/192.1; 428/336; 428/697; 428/698; 428/699

[58] Field of Search ................... 428/697, 698, 428/699, 216, 336; 51/295, 307, 309; 204/192, 192.1

[56] References Cited

U.S. PATENT DOCUMENTS

| | | | |
|---|---|---|---|
| 4,252,862 | 2/1981 | Nishida | 428/457 |
| 4,761,346 | 8/1988 | Naik | 428/627 |
| 4,871,434 | 10/1989 | Munz et al. | 204/192.16 |
| 5,208,102 | 5/1993 | Schulz et al. | 428/697 |
| 5,306,407 | 4/1994 | Hauzer et al. | 204/192.38 |
| 5,330,853 | 7/1994 | Hofman et al. | 428/699 |
| 5,549,975 | 8/1996 | Schulz et al. | 428/553 |

*Primary Examiner*—Archene Turner
*Attorney, Agent, or Firm*—Townsend and Townsend and Crew LLP

[57] ABSTRACT

Ternary hard material layers are described to which a small proportion of yttrium is added to increase the resistance to wear at elevated temperatures.

30 Claims, 8 Drawing Sheets

Deposition Process
(Schemetically)

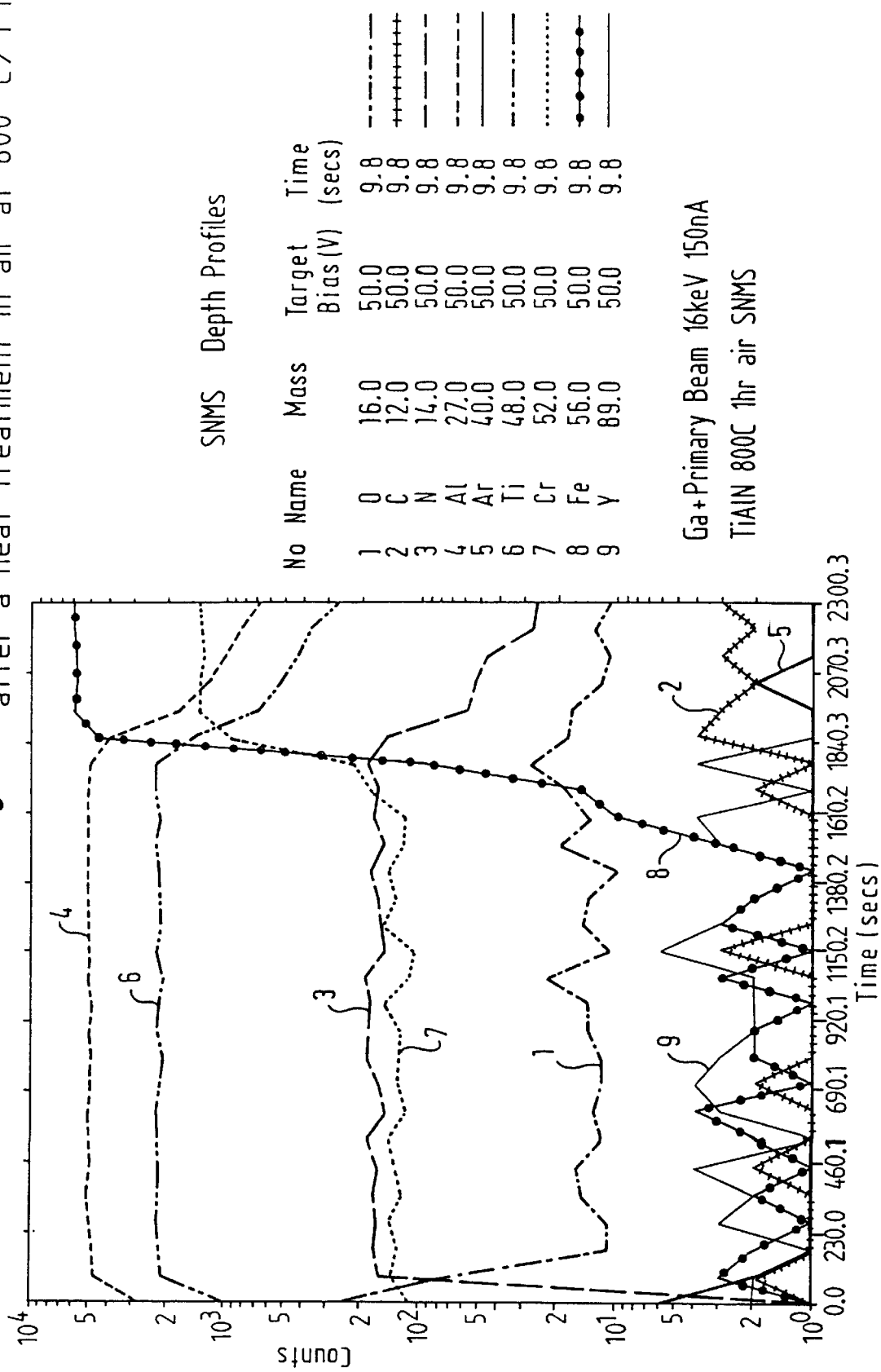

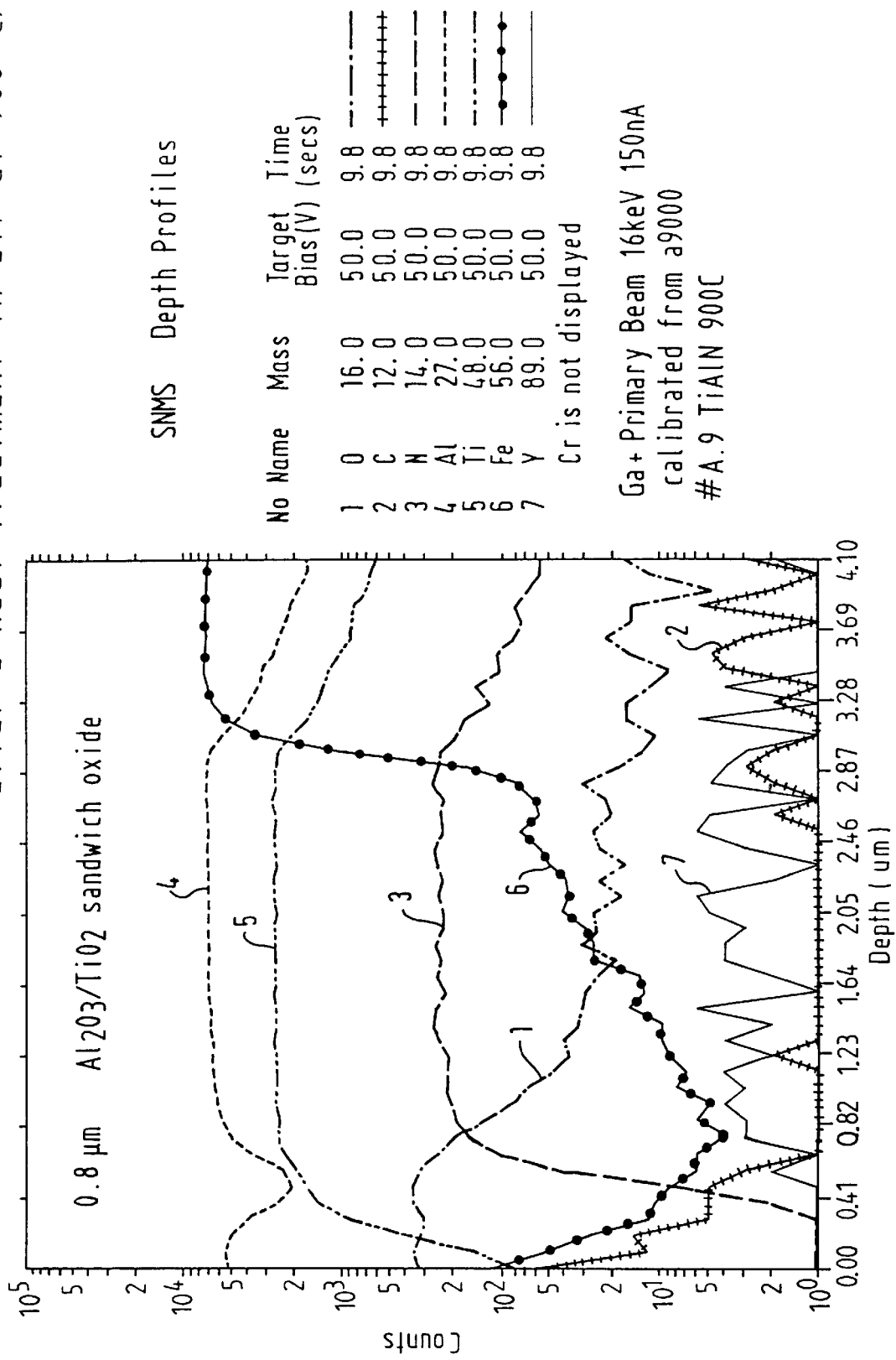

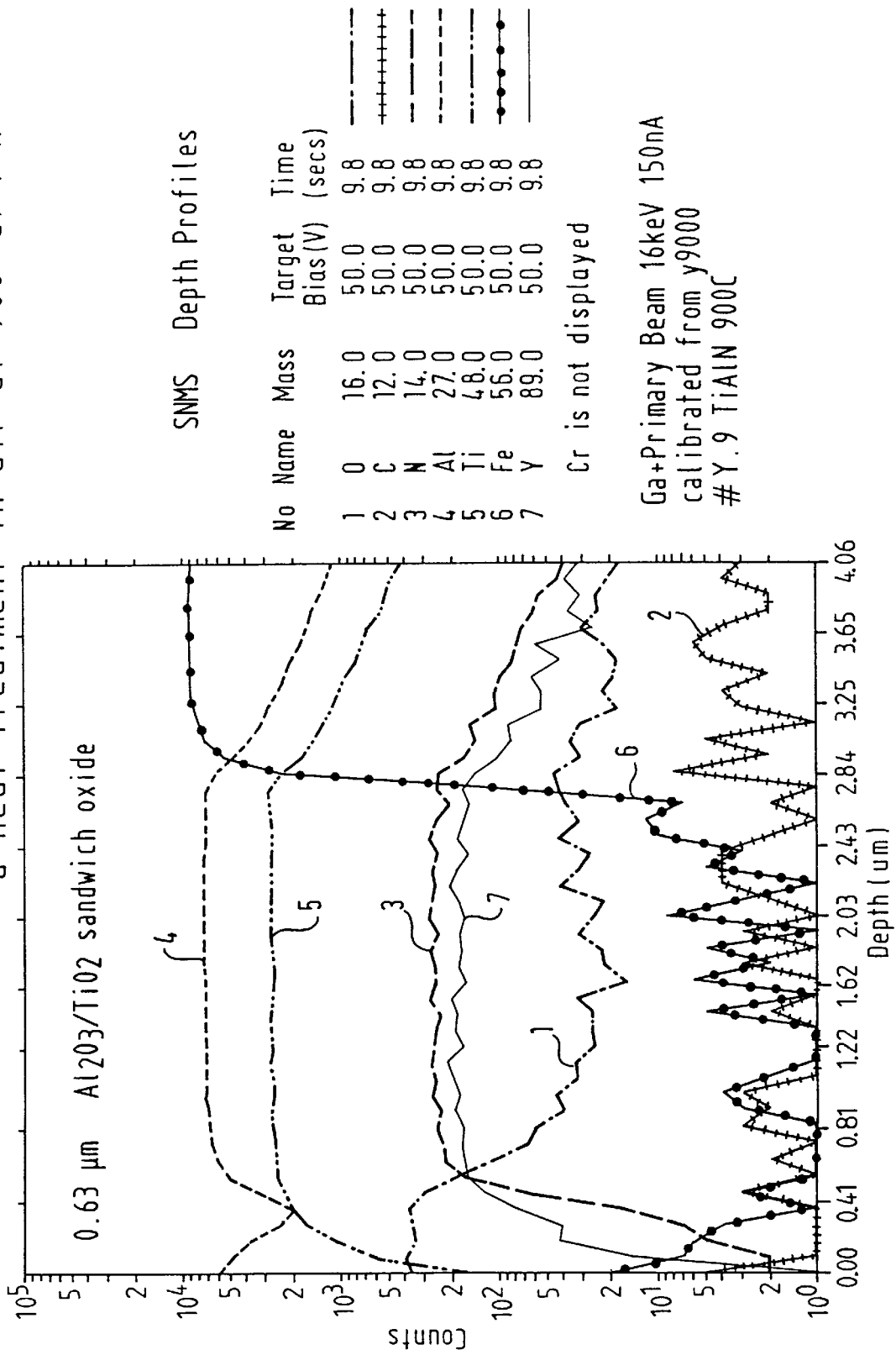

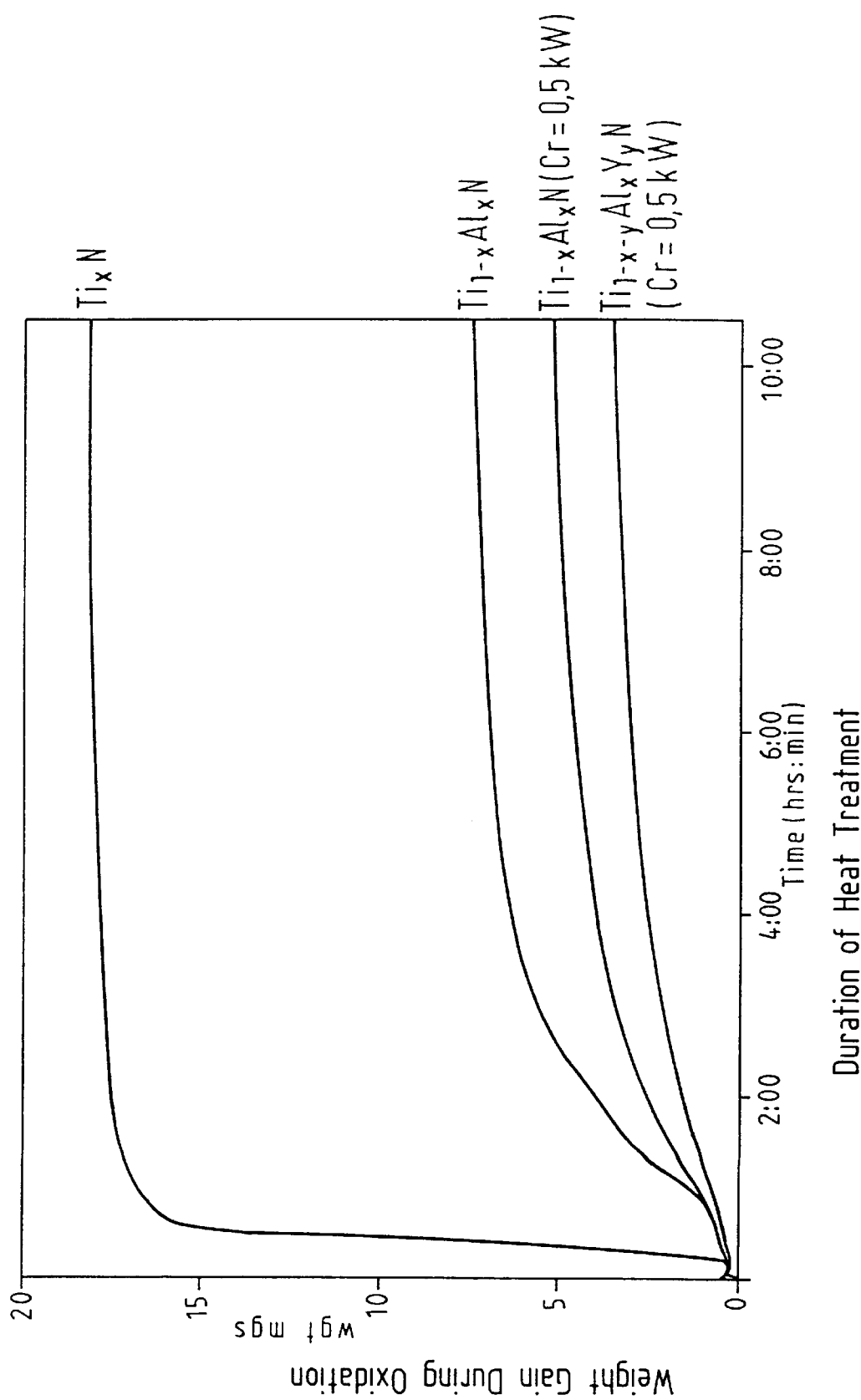
Fig. 6 Isothermal Thermo Gravimetry of Various Hard Coatings

Fig. 7 XRD Analysis of TiAlN and TiAlYN
(Polycrystalline B1-NaCl Structure)
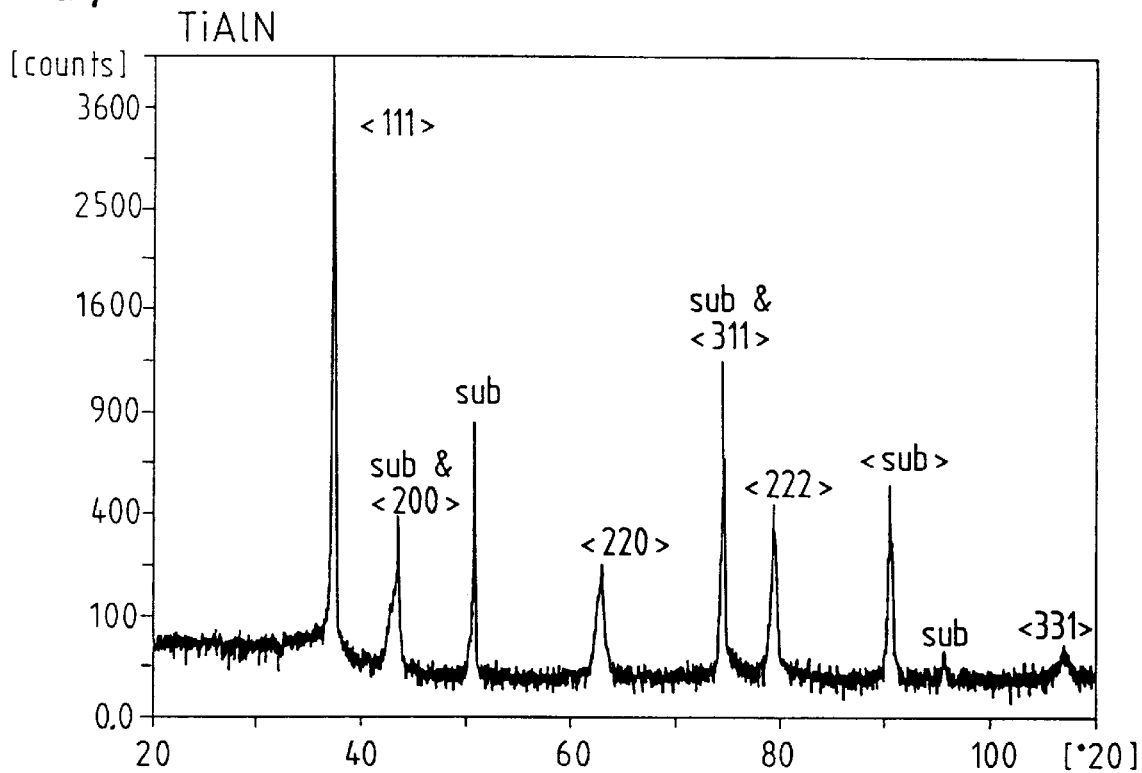
a) TiAlN
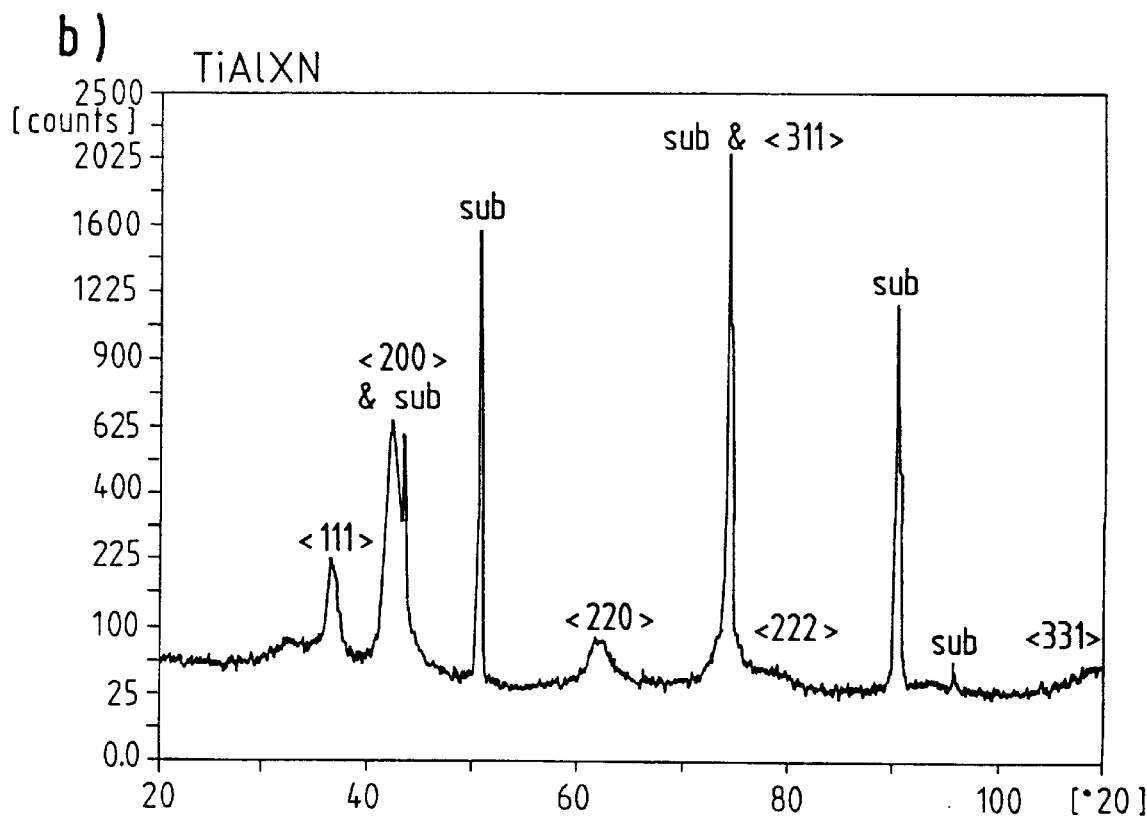
b) TiAlXN Fig. 8 Computer Processed TEM Cross-Section Images (Magnification: 50000)
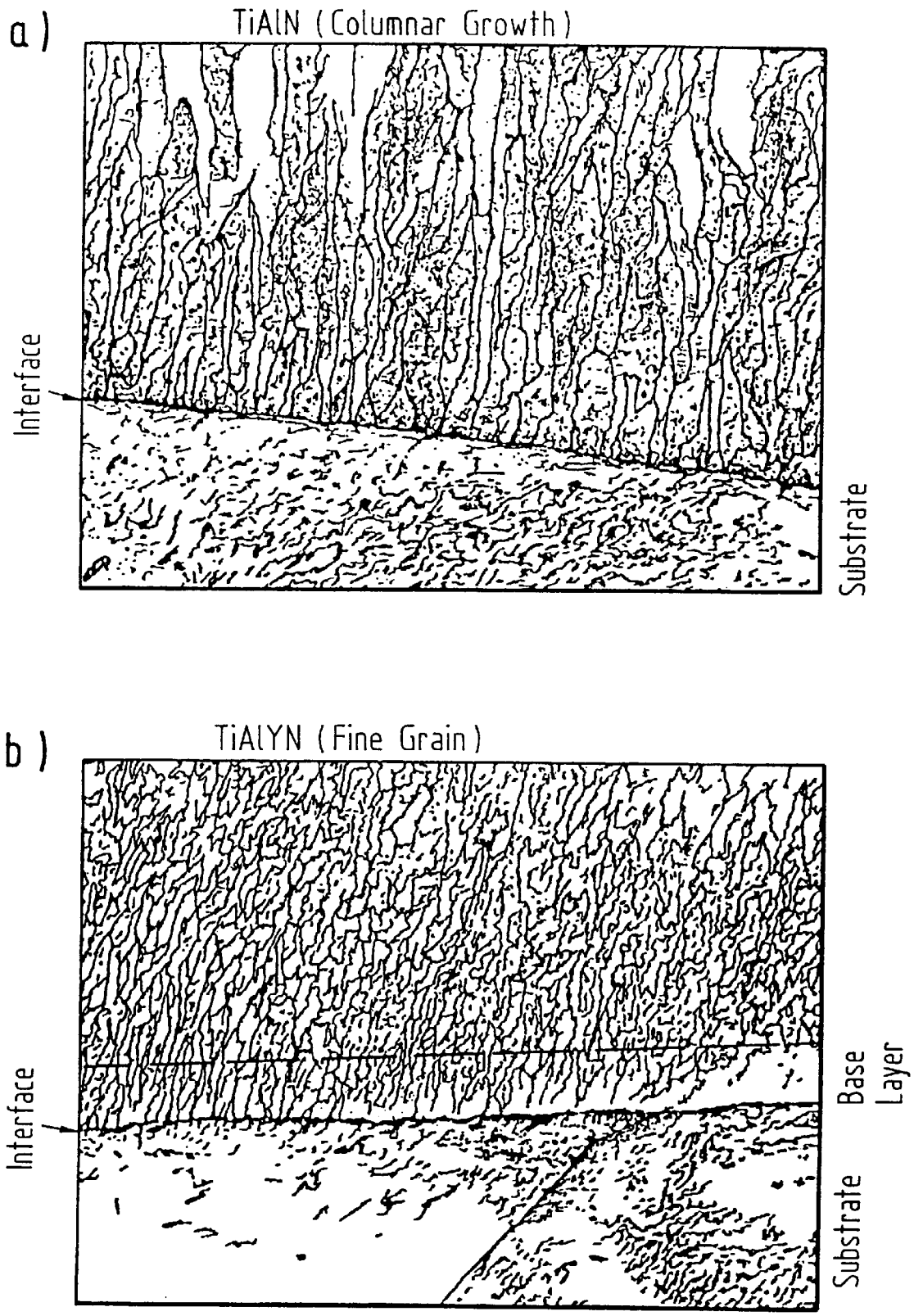

HARD MATERIAL COATING WITH YTTRIUM AND METHOD FOR ITS DEPOSITION

BACKGROUND OF THE INVENTION

1. Field of the Invention

The invention relates to PVD hard coating materials for engineering components used in a hot environment, especially for tools for the coolant-free and lubricant-free machining of materials.

The coolant-free and lubricant-free machining of materials, in particular of metals like die steels or aluminium alloys, is increasingly gaining in significance, in particular in the automotive industry.

2. Description of the Prior Art

TiN and TiCN layers deposited by the known PVD and CVD methods cannot satisfy this object satisfactorily because both begin to oxidize at operating temperatures beyond 400° C. and thus considerable wear arises, in particular at the cutting edges. This is because the oxides which are formed are very brittle and spall off from the TiN or TiCN coating due to their low bond strength and different thermal expansion. This leads to a continuous and considerable reduction of the layer thickness in the edge region during cutting operations at elevated temperatures. Analogous effects can also arise with forming tools.

It has been found that TiAlN applied by the PVD process as a hard material coating is much better suited to resisting the oxidation processes. It has been reported that the temperature at which oxidation sets in can be increased to 700 to 800° C when the hard material layer consists, for example, of 50 at % Ti and of 50 at % Al.(W.-D. Münz, J. Vac. Sci. Technol., A4 (6) (1986) 2117).

Even higher Al contents have been reported, i.e. Al contents of up to 70 at % of the respective metal content. It is known from the field of turbine blade coating that the addition of yttrium increases the oxidation resistance of superalloys such as CoCrAlY or of thermally insulating layers of zirconium oxide.

In the hard material coating field a layer of TiYN has admittedly been reported with a Y-content of more than 10 at %; however, this layer proved to be unsuitable for industrial use, mainly because of its brittleness. (J. R. Roos, J. P. Celis, E. Vancoille, H. Veltrop, S. Boelens, F. Jungblut, J. Ebberink, H. Homberg, Thin Solid Films, 193/194 (1990) 1542).

SUMMARY OF THE INVENTION

An object of the invention is to thermally stabilize the interface between the hard material coating and the respective substrate and to further reduce the onset of oxidation.

For this purpose, the invention proposes the addition of small quantities of yttrium to binary, ternary or quaternary TiAl-based multi-component layers. Preferably the yttrium is unevenly distributed with respect to the growth direction of the coating. That means that the distribution is not uniform perpendicular to the substrate surface.

In particular, pure yttrium or alloys containing yttrium and scandium, are added to todays well known TiAlN.

In accordance with the invention, yttrium is preferably added in the concentration range between 0.1 to 4.0 at % in ternary TiAlN alloys or in TiAlN/CrN, TiAlN/ZrN, TiAlN/TiN, TiAlN/MoN and TiAlN/WN multi-layer coatings. It will be understood that the percentage value of yttrium is quoted as a percentage of the metallic constituents only. Preferably a Y-content of only 1.5 to 2.0 at % of the Ti and Al constituents is recommended and used.

The coating of the tools is preferably produced by sputtering (unbalanced magnetron UBM) (W.-D. Münz, Surf. Coat. Technol., 48(1991) 81), cathodic arc evaporation (e.g. steered arc) or with combination methods as cathodic arc evaporation/sputtering (W.-D. Münz, D. Schulze, F. J. M. Hauzer, Surf. Coat.Technol., 50 (1992) 169) or sputtering/low voltage electron beam evaporation (anodic arc evaporation) or combined low voltage evaporation/cathodic arc evaporation.

The uneven or non-uniform distribution of yttrium in the growth direction of the hard coating is achieved by the special choice of the deposition conditions. It has to be stated that the lateral distribution of the yttrium parallel to the substrate surface has to be as uniform as possible. The uneven distribution in growth direction is obtained by using a multitarget unbalanced magnetron sputtering machine. FIG. 1 shows the cross-section of an industrial four target PVD coater (detailed description: W.-D. Münz, D. Schulze, F. J. M. Hauzer, Surf. Coat. Technol., 50 (1992) 169). Four cathodes are mounted vertically into the doors of the vacuum chamber. The cathodes are of linear design. Four rectangular targets with a typical dimension of 60 cm×20 cm (target thickness: 1–2 cm) are mounted on the four cathodes. The substrates to be coated are mounted on a rotating turntable as shown in FIG. 1. They are subjected to a three-fold planetary rotation as outlined by the arrows in FIG. 1. During coating they are passing all four cathodes collecting vaporized atoms sputtered from the cathodes. If a uniform distribution of an alloy material is required all four targets should be mounted with identical sputtering materials. In case of the TiAlYN deposition all four cathodes should be equipped with targets of the same composition.

It is a preferred feature of the invention to avoid yttrium being incorporated over the entire hard material layer thickness with high uniformity as would be the case if the yttrium would be distributed in equal concentrations over all targets in a multi-target deposition system involved in the deposition process.

Thus, according to the invention, the yttrium is unevenly distributed over the entire hard material layer thickness and this special distribution can be obtained in a multi-target deposition system in which the yttrium is not alloyed into all targets and preferably only into a single target.

When using multi-target deposition systems with the yttrium being distributed in equal concentrations over all targets involved in the deposition process of TiAlN, it can be shown that yttrium is incorporated over the entire hard material layer with high uniformity.

Whereas this may influence the formation of dense oxide layers on top of the hard nitride coating positively, e.g. on TiAlN, it must be stated that there is destabilization of the interface between the nitride coating and the substrate taking place with increasing temperatures. It was only possible to prevent this destabilization by the described uneven distribution of the Y in the growth direction of the coating.

In detail the following target assembly has been used. To carry out the combined steered arc/unbalanced magnetron deposition process, one cathode was equipped with a Cr target. The Cr target was used to perform the metal-ion-etch process in a steered arc discharge to establish in vacuo a clean substrate surface. Cr was chosen as target material to reduce the generation of droplets which deposit on the substrate surface and cause growth defects there in the deposited TiAlN (W.-D. Münz, I. V. Smith, L. A. Donohue, V. S. Brooks, German Patent Application 195 47 305.1) or TiAlYN coating. Two targets consisted of 50 at % Ti and 50 at % Al. The Y-containing target with typically 48 at % Ti, 48 at Al and 4 at % Y was mounted between the two TiAl targets.

Figure 2:
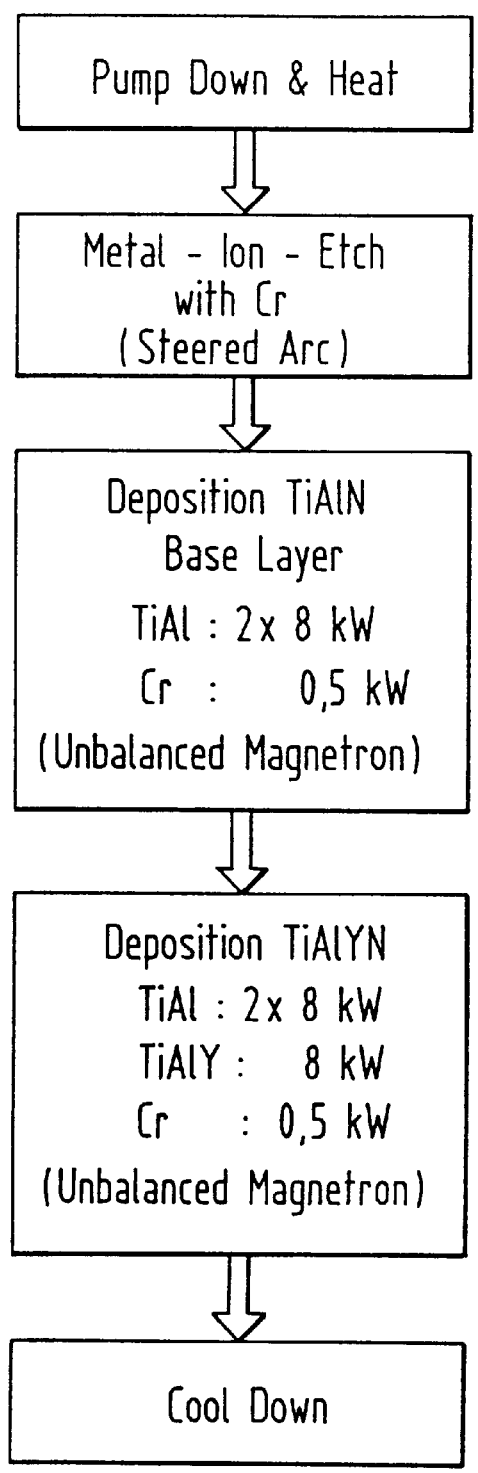

FIG. 1 describes the actual target assembly. A schematic process sequence is outlined in FIG. 2. It can be seen there also that the deposition of the hard coating with the unbalanced magnetron starts initially without using the TiAlY target. It has been found that the deposition of a pure TiAlN base layer enhances the adhesion of a TiAlN based quaternary coating like TiAlNbN or as in the case described here with TiAlYN. It has also to be mentioned that the Cr cathode was used during the deposition of TiAlN and TiAlYN in the unbalanced magnetron mode on a very low power level. Whereas the TiAl and TiAlY targets were operated with 8 to 10 kW, the Cr target was powered with 0.2 to 1 kW, typically with 0.5 kW. Initially, it was thought to prevent cross-contamination from the TiAl targets. However, it has been found out surprisingly that a low chromium content of the coating led to an increase of the oxidation resistance when compared to a pure TiAlN coating. A detailed set of coating parameters is given in Table 1.

TABLE 1

Important Process Parameters for a Four Cathode Combined Arc/ Unbalanced Magnetron PVD Coating Machine with a Typical Target Size of 60 cm x 20 cm

| Process Steps | Units | Parameter Range | Recommended Conditions |
|---|---|---|---|
| Substrate Heat-up Temperature | °C. | 250–550 | 450 |
| Metal Ion Etch | | | |
| Target Material | at % | 100 Cr or | 100 Cr |
| | at % | 100 Mo | |
| Pressure Argon | mbar | $0-5.10^{-3}$ | $0.3-0.6 \times 10^{-3}$ |
| Current | A | 50–200 | 100 |
| Substrate Bias | V | −1800 to −1500 | −1200 |
| Temperature | °C. | 350–550 | 420–450 |
| Duration | min | 1–20 | 10 |
| Deposition Base Layer (UBM) | | | |
| Pressure total (Ar + N$_2$) | mbar | $2-10 \times 10^{-3}$ | $3.15 \times 10^{-3}$ |
| Pressure Ar | mbar | $1.5-9 \times 10^{-3}$ | $3.25 \times 10^{-2}$ |
| Number UBM cathodes | | 2 | 2 |
| Power per TiAl cathode | kW | 6–12 | 8 |
| Power Cr Cathode | kW | 0–1.5 | 0.5 |
| Bias voltage | V | −50 to −100 | −75 |
| Bias Current Density | mA/cm$^2$ | 2–5 | 3 |
| Temperature | °C. | 350–550 | 420–450 |
| Thickness | μm | 0.1–2 | 0.2 |
| Deposition of TiAlYN | | | |
| Pressure total (Ar + N$_2$) | mbar | $2-10 \times 10^{-3}$ | $3.5 \times 10^{-3}$ |
| Pressure Ar | mbar | $1.5-9 \times 10^{-3}$ | $3.25 \times 10^{-3}$ |
| Power TiAl (2x) | kW | 6–12 | 6 |
| Power TiAlY (1x) | kW | 6–12 | 6 |
| Power Cr | kW | 0.2–1.5 | 0.5 |
| Bias voltage | V | −50 to −100 | −75 |
| Bias Current Density | mA/cm$^2$ | 2–5 | 3 |
| Tenperature | °C. | 350–550 | 420–450 |
| Thickness | μm | 2–6 | 3–5 |
| Cooling down of Substrate Temperature | °C. | 150–300 | 200+ |

When using the "preferred deposition conditions" as outlined in Table 1 the following film composition of the metallic constituents of the hard material coating has been found by using WDX (Wavelength Dispersive X-Ray Analysis):

40 at % Ti
56 at % Al
2 at % Y
2 at % Cr

The stabilisation of the interface between the hard coating and a steel substrate by the uneven incorporation of Y is shown in FIGS. 3 to 5 using SNMS (Secondary Neutral Mass Spectroscopy) analyses.

FIG. 3 shows the completely uniform distribution of the coating constituents Al (4), Ti (6), Cr (7), N (3) over the complete thickness range. The intensity of the metal concentration is given in non-calibrated counts. In this coating no Y was incorporated. Therefore, Y is only identified as a low concentrated random element. The sample has been heat treated for one hour in air at 800° C. Despite this heat treatment a sharp decay of the Fe signal (8) is observed at the interface indicating that no significant diffusion of Fe into the hard coating has taken place. Only a rather thin oxide layer is formed on top of the TiAlN coating as indicated by the sharp increase of the oxygen signal (1) and the parallel decrease of the N signal (3). However, if one increases the heat treatment temperature to 900° C. a significant diffusion of Fe (6) into the coating is observed (FIG. 4). The formation of a surface oxide layer is intensified. Concluding from the shape of signal 4 (Al), 5 (Ti), 1 (O) and 3 (N) an almost N-free oxide is formed with an Al rich top layer and a Ti rich oxide between the Al-oxide and the TiAlN film. The formation of this N-free sandwich oxide on top of a TiAlN coating has been confirmed by earlier work (D. McIntyre, J. E. Greene, G. Hakansson, J.-E. Sundgren, W.-D. Munz, J. Appl. Phy. 67 (1990) 1542). Extrapolation from the observed data (point "A" in FIG. 4) allow the estimation of an oxide thickness of 0.8 μm. The uneven incorporation of Y into the coating completely changes the results gained by SNMS analyses (FIG. 5). Similar to the case at 800° C. a steep decay of the Fe signal /6 is obtain served at the interface thus demonstrating clearly that the Fe diffusion is completely suppressed. The Y itself seem to be distributed uniformly between the top oxide and the interface. SNMS does not permit the resolution of the layered and therefore uneven incorporation of Y into the coating. Because of the rotation of the substrate holders the Y concentration may be regarded as a layered concentration, e.g. varying approximately sinusoidally in the growth direction. SNMS shows only that the Al rich oxide is more or less Y-free and that there exists some indication that Y is incorporated into the Ti oxide portion. It can also be seen that the thickness of the sandwich oxide is reduced by the incorporation of Y to an approximate thickness of 0.65 μm.

The positive influence of low concentrated Y but also of Cr onto the oxidation resistance respectively onto the formation of a passivating oxide coating on top of the hard nitride coating has been established by TG (Thermo Gravimetric) analyses, too. FIG. 6 shows isotherms recorded at a temperature of 900° C. and over a reaction time in air up to 10 hours. It can be clearly seen that 2 at % Cr already reduce the weight gain due to oxidation during the reaction of TiAlN with hot air. However, the most pronounced improvement was found when Y was added in the "uneven" mode into the coating. For comparison reasons the oxidation behavior of TiN is given in FIG. 6 also. One recognizes a steep increase in weight gain due to the spontaneous formation of TiO$_2$ at 900° C. The coating is completely oxidized already after 1 hour. Therefore, no further weight gain is observed due to the fact that the stainless steel substrate material oxidizes only marginally in this temperature range.

The discrete concentration of Y into one target led to a substantial influence of the growth mechanism of the coating. Coatings without Y showed in X-ray analyses with pronounced <111> preferred orientation. FIG. 7a exhibits an XRD diagram of a $Ti_{0.42}Al_{9.58}N$ coating. The XRD diagram of TiAlN with continuous Y distribution is very similar although the peaks are somewhat broader, indicating higher internal stresses and smaller grain size of the polycrystalline coating.

Incorporating Y from one single target completely changes the XRD spectrum. The <111> preferred orientation is converted into a <200> preferred orientation with much less sharp peaks as shown in FIG. 7b. Both the broader peaks and the <200> preferred orientation indicate smaller grain sizes and continuous re-nucleation of the growing film.

It has been found that the above described drastic thermal stabilisation of the interface can—for example—be achieved under target arrangement conditions as described in FIG. 1. It is also important to note that linear cathodes allow a very uniform distribution of the Y content parallel to the substrate surface and across the full height of the cathode length as compared to cathode arrangements with a series of small circular cathodes as very often used in cathodic arc evaporation systems.

The assumption of a continuous re-nucleation and grain refinement caused by the uneven distribution of Y in the growth direction of the coating can be strengthened by cross-section TEM (Transmission Electron Microscopy) analyses.

FIGS. 8a and 8b show computer processed TEM images which show in FIG. 8a the typical columnar growth of TiAlN coatings as reported in earlier work (G. Håkansson, J.-E. Sundgren, D. McIntyre, E. Greene, W.-D. Münz, Thin Solid Films, 153 (1987) 55).

FIG. 8b however demonstrates a very fine grained film growth with clear indications of regular columnar growth only in the direct vicinity of the interface. In this section of the coating the base layer was deposited as outlined in FIG. 2. FIG. 8b supports also the understanding of reduced oxidation of Y containing TiAlN coating due to the obviously prolonged diffusion paths for oxygen along the reduced grain sizes. It is also common knowledge that fine grained hard coatings are subjected to high internal stresses. The TEM results therefore justify the introduction of the Y-free base layer since via this graded interface the influence of the internal stresses onto the adhesion of the coatings should be reduced. The higher internal stresses of the fine grained TiAlYN may be quantified also by an enhanced hardness HK 2700 in comparison to the Y-free coating with typically HK 2400.

Experiments showed that the achievements generated by the described incorporation of Y can be improved further when Yttrium is alloyed with Scandium. A typical composition of 50 at % Y and 50 at % Sc has been found to have a significant effect.

Furthermore, it has been shown that the hard material layer should itself be very smooth (W.-D. Münz, I. V. Smith, L. A. Donohue, J. S. Brooks, Patent Application 195 47 305.1) in order to bring about the advantageous influence of the yttrium. With a surface roughness in the range Ra=0.150 to 0.3 $\mu$m, produced for example by droplet formation during cathodic arc discharge evaporation, the improvement of the cutting behaviour of twist drills in uncooled operation is rather limited. With a roughness of Ra<0.050 $\mu$m one could, however, find substantial improvements of the service life.

The following tests were made for twist drills:

| tool | twist drills 8 mm diameter |
|---|---|
| blind holes | 27 mm in diatneter |
| material machined | GG25 (test iron) |
| cutting speed | 60 m/min |
| feed | 0.2 mm/revolution |

The drilling tests brought the following results:

| drill uncoated | | 17 holes |
|---|---|---|
| drill TiAlN | (Ra = 0.15–0.20 $\mu$m) | 100 holes |
| drill TiAlN | (Ra $\leq$ 0.05 $\mu$m) | 250 holes |
| drill TiAlYN | (Ra $\leq$ 0.05 $\mu$m) | 600–1,100 holes |

REFERENCE

W.-D. Münz J. Vac. Sci. Technol. A4 (6) (1986) 2117

J. R. Roos, J. P. Celis, E. Vancoille, H. Veltrop, S. Boelens, F. Jungblut, J. Ebberink, H. Homberg Thin Solid Films, 193/194 (1990) 1542

W.-D. Münz Surf. Coat. Technol. 48 (1991) 81

W.-D. Münz, D. Schulze, F. J. M Hauzer Surf. Coat. Technol., 50 (1992) 169

W.-D. Münz Werkstoffe und Korrosion, 41 (1990) 753

W.-D. Münz, I. V. Smith, L. A. Donohue, J. S. Brooks German Patent Application 195 47 305.1

W.-D. Münz. T. T. Trink, T. Hurkmans D 44 05 477 A1

D.McIntyre, J. E. Greene, G. Håkansson, J.-E. Sundgren, W.-D. Münz J. Appl. Phys. 67(1990) 1542

G. Håkansson, J.-E. Sundgren, D. McIntyre, J. E. Greene, W.-D. Münz Thin Solid Films, 153 (1987) 55

We claim:

1. Hard material coatings manufactured by means of one of cathodic arc evaporation, sputtering, combination processes of sputtering/cathodic arc evaporation, sputtering/low voltage electron beam evaporation, or low voltage evaporation/cathodic arc evaporation, the hard material coatings consisting substantially of:

a hard material layer of a binary, ternary or quaternary TiAl based multicomponent hard material layer comprising nitride or carbonitride with an Al-content of 10 to 70 at %, wherein the layer contains about 0.1 to 4 at % yttrium unevenly distributed over the entire hard material layer in a growth direction of the coating.

2. A hard material coating in accordance with claim 1 wherein the hard material layer consists of a polycrystal-line fcc structure (B1-NaCl-type) with a <200> preferred orientation.

3. A hard material coating in accordance with claim 1 wherein the intensities of the major XRD peaks from the pattern (111), (220), (311) are smaller than that of a (200) peak intensity.

4. A hard material coating in accordance with claim 3 wherein the intensities are smaller by at least 70%.

5. A hard material coating in accordance with claim 1 wherein the full width half maximum (FWHM) of the (200) XRD peak is larger than 1° of 2.

6. A hard material coating in accordance with claim 1 wherein the yttrium content amounts to approximately 1.5 to 2.0 at %.

7. A hard material coating in accordance with claim 1 wherein the yttrium is replaced by an alloy of yttrium and scandium that is unevenly distributed over the entire hard material layer.

8. A hard material coating in accordance with claim 7 wherein the scandium content amounts to 50 at %.

9. A hard material coating in accordance with claim 1 wherein a base layer adjacent the hard material contains substantially no yttrium.

10. A hard material coating in accordance with claim 1 wherein the coating consists of a multi-layer superlattice of TiAlN/TiN, TiAlN ZrN, TiAlN/CrN, TiAlN/MoN, TiAlN/WN with an yttrium content of 0.1 to 4 at %.

11. A hard material coating in accordance with claim 1 wherein the coating consists of a multi-layer of superlattice of TiAlN/TiN, TiAlN ZrN, TiAlN/CrN, TiAlN/MoN, TiAlN/WN, whereby the yttrium is incorporated in the TiAlN layer of the multilayer superlattice.

12. A hard material coating in accordance with claim 1 wherein 1 to 10 at % of the total metal content consists of Cr.

13. A hard material coating in accordance with claim 12 wherein 2 at % of the total metal content consists of Cr.

14. A hard material coating in accordance with claim 1 wherein additional carbon content of about 30 to 70 at % is present in the hard metal layer.

15. A hard material coating in accordance with claim 14 wherein the carbon is exclusively introduced into an outer layer zone having a thickness in a range of 0.5 to 1 $\mu$m.

16. A hard material coating in accordance with claim 1 wherein the coating has a thickness in a range of approximately 1.5 to 5 $\mu$m independent of the composition of the hard metal layer.

17. A hard metal coating in accordance with claim 1 wherein the hard metal layer on a substrate polished to Ra 0.00 $\mu$m has a surface roughness of less than or equal to 0.050 $\mu$m.

18. A hard metal coating in accordance with claim 1 wherein the hard metal coating is applied to a substrate material consisting of high-speed steel or hard metal.

19. A PVD method for coating substrates with a hard material coating, wherein the hard material coating is manufactured by means of one of cathodic arc evaporation, sputtering, combination processes of sputtering/cathodic arc evaporation, sputtering/low voltage electron beam evaporation, or low voltage evaporation/cathodic arc evaporation, the hard material coatings consisting substantially of:

a hard material layer of a binary, ternary or quaternary TiAl based multi-component hard material layer comprising nitride or carbonitride with an Al-content of 10 to 70 at %, wherein the layer contains about 0.1 to 4 at % yttrium unevenly distributed over the entire hard material layer in a growth direction of the coating, wherein the method includes the use of multi-target deposition systems in which at least one of a plurality of cathodes does not include a yttrium containing target and the substrates to be coated are mounted on rotatable substrate fixturing systems so that the substrates are intermittently exposed to cathodes including a yttrium containing target.

20. A method on accordance with claim 19 wherein the coating is deposited into a four target combined arc/unbalanced magnetron PVD position machine including four cathodes only one of which is equipped with a yttrium containing target and the substrates to be coated are mounted on a rotatable substrate fixturing system allowing at least twofold substrate rotations.

21. A method in accordance with claim 20 wherein the four cathodes are four vertically arranged linear cathodes.

22. A method in accordance with claim 20 wherein one of the plurality of cathodes is used as a cathodic arc etching cathode and wherein three other cathodes are furnished with TiAl targets and only one of the three cathodes is equipped with a yttrium containing target.

23. A method in accordance with claim 22 wherein the cathode used as a cathodic arc etching cathode is equipped with a Cr target.

24. A method in accordance with claim 23 wherein Cr is mixed into at least one of the TiAl targets of the PVD coating machine.

25. A method in accordance with claim 24 wherein the PVD coating machine is a arc coating machine.

26. A method in accordance with claim 22 wherein a cathode behind the target containing yttrium is first switched on after deposition of a base layer on a substrate containing substantially no yttrium.

27. A hard material coating in accordance with claim 1 wherein the hard metal layer consists substantially of the ternary hard material layer TiAlN with an Al content of 10 to 70 at % and wherein 0.1 to 4 at % yttrium is unevenly distributed over the TiAlN layer.

28. A hard material coating in accordance with claim 27 wherein the intensities of the major XRD peaks from the pattern (111), (220), (311) are smaller than that of a (200) peak intensity.

29. A hard material coating in accordance with claim 28 wherein the intensities are smaller by at least 70%.

30. Hard material coatings manufactured by means of one of cathodic arc evaporation, sputtering, combination processes of sputtering/cathodic arc evaporation, sputtering/low voltage electron beam evaporation; or low voltage evaporation/cathodic arc evaporation, the hard material coatings consisting substantially of:

a hard material layer of a binary, ternary or quaternary TiAl based multi-component hard material layer comprising nitride or carbonitride with an Al-content of 10 to 70 at %, wherein the layer contains about 0. 1 to 4 at % yttrium; and wherein a base layer adjacent to the hard material contains substantially no yttrium.

* * * * *